(12) United States Patent  (10) Patent No.: US 6,396,134 B2
Kinsman  (45) Date of Patent: May 28, 2002

(54) INTERDIGITATED CAPACITOR DESIGN FOR INTEGRATED CIRCUIT LEAD FRAMES

(75) Inventor: Larry D. Kinsman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/897,810

(22) Filed: Jun. 29, 2001

Related U.S. Application Data

(63) Continuation of application No. 09/543,032, filed on Apr. 5, 2000, now Pat. No. 6,265,764, which is a continuation of application No. 09/053,182, filed on Apr. 1, 1998, now Pat. No. 6,114,756.

(51) Int. Cl.⁷ .............................................. H01L 23/495
(52) U.S. Cl. ..................... 257/676; 257/666; 438/123
(58) Field of Search ................................ 257/676, 666, 257/307; 438/111, 123

(56) References Cited

U.S. PATENT DOCUMENTS

| | | |
|---|---|---|
| 3,460,010 A | 8/1969 | Domenico et al. |
| 3,538,397 A | 11/1970 | Davis |
| 3,769,105 A | 10/1973 | Chen et al. |
| 3,772,097 A | 11/1973 | Davis |
| 4,164,751 A | 8/1979 | Tasch, Jr. |
| 4,266,282 A | 5/1981 | Henle et al. |
| 4,317,686 A | 3/1982 | Anand et al. |
| 4,349,862 A | 9/1982 | Bajorek et al. |
| 4,410,905 A | 10/1983 | Grabbe |
| 4,423,431 A | 12/1983 | Sasaki |
| 4,427,989 A | 1/1984 | Anantha et al. |
| 4,477,736 A | 10/1984 | Onishi |
| 4,493,056 A | 1/1985 | Mao |
| 4,567,542 A | 1/1986 | Shimada et al. |
| 4,577,214 A | 3/1986 | Schaper |
| 4,595,945 A | 6/1986 | Graver |
| 4,604,639 A | 8/1986 | Kinoshita |
| 4,605,980 A | 8/1986 | Hartranft et al. |
| 4,641,425 A | 2/1987 | Dubuisson et al. |
| 4,654,690 A | 3/1987 | Okada et al. |
| 4,656,605 A | 4/1987 | Clayton |
| 4,680,613 A | 7/1987 | Daniels et al. |
| 4,691,304 A | 9/1987 | Hori et al. |
| 4,720,737 A | 1/1988 | Shirato |
| 4,737,830 A | 4/1988 | Patel et al. |
| 4,777,518 A | 10/1988 | Mihara et al. |
| 4,780,795 A | 10/1988 | Meinel |
| 4,780,846 A | 10/1988 | Tanabe et al. |

(List continued on next page.)

FOREIGN PATENT DOCUMENTS

| | | |
|---|---|---|
| DE | 3626151 | 2/1988 |
| JP | 56-15065 | 2/1981 |
| JP | 58-64048 | 4/1983 |
| JP | 58-77251 | 5/1983 |
| JP | 61-73367 | 4/1986 |
| JP | 63-93139 | 4/1988 |
| JP | 3-165549 | 7/1991 |
| JP | 3276747 | 12/1991 |
| JP | 4162657 | 6/1992 |
| JP | 4188759 | 7/1992 |
| JP | 6045504 | 2/1994 |

OTHER PUBLICATIONS

"Three Metal Layer QFP (TM QFP)", Publication of Shinko Electric Industries Co., LTD. (2 pages).

*Primary Examiner*—Sheila V. Clark
(74) *Attorney, Agent, or Firm*—TraskBritt

(57) ABSTRACT

A semiconductor device includes a two-part, coplanar, interdigitated decoupling capacitor formed as a part of the conductive lead frame. For down-bonded dice, the die attach paddle is formed as the interdigitated member. Alternatively, an interdigitated capacitor may be placed as a LOC type lead frame member between electrical bond pads on the die. The capacitor sections comprise Vcc and Vss bus bars.

34 Claims, 6 Drawing Sheets

U.S. PATENT DOCUMENTS

| | | |
|---|---|---|
| 4,835,416 A | 5/1989 | Miller |
| 4,862,245 A | 8/1989 | Pashby et al. |
| 4,879,631 A | 11/1989 | Johnson et al. |
| 4,891,687 A | 1/1990 | Mallik et al. |
| 4,937,649 A | 6/1990 | Shiba et al. |
| 4,949,161 A | 8/1990 | Allen et al. |
| 4,965,654 A | 10/1990 | Karner et al. |
| 4,984,059 A | 1/1991 | Kubota et al. |
| 4,994,936 A | 2/1991 | Hernandez |
| 5,010,387 A | 4/1991 | Dunaway et al. |
| 5,032,892 A | 7/1991 | Chern et al. |
| 5,032,895 A | 7/1991 | Horiuchi et al. |
| 5,063,432 A | 11/1991 | Mu |
| 5,066,614 A | 11/1991 | Dunaway et al. |
| 5,095,402 A | 3/1992 | Hernandez et al. |
| 5,099,306 A | 3/1992 | Dunaway et al. |
| 5,103,283 A | 4/1992 | Hite |
| 5,105,257 A | 4/1992 | Michii |
| 5,140,496 A | 8/1992 | Heinks et al. |
| 5,147,815 A | 9/1992 | Casto |
| 5,155,656 A | 10/1992 | Narashimhan et al. |
| 5,161,729 A | 11/1992 | Dunaway et al. |
| 5,200,364 A | 4/1993 | Loh |
| 5,212,402 A | 5/1993 | Higgins, III |
| 5,218,168 A | 6/1993 | Mitchell et al. |
| 5,220,209 A | 6/1993 | Seymour |
| 5,228,192 A | 7/1993 | Salatino |
| 5,229,639 A | 7/1993 | Hansen et al. |
| 5,235,209 A | 8/1993 | Shimizu et al. |
| 5,237,202 A | 8/1993 | Shimizu et al. |
| 5,250,840 A | 10/1993 | Oh et al. |
| 5,256,598 A | 10/1993 | Farnworth et al. |
| 5,266,821 A | 11/1993 | Chern et al. |
| 5,272,590 A | 12/1993 | Hernandez |
| 5,281,556 A | 1/1994 | Shimizu et al. |
| 5,283,717 A | 2/1994 | Hundt |
| 5,291,060 A | 3/1994 | Shimizu et al. |
| 5,307,309 A | 4/1994 | Protigal et al. |
| 5,311,056 A | 5/1994 | Wakabayashi et al. |
| 5,360,992 A | 11/1994 | Lowrey et al. |
| 5,365,106 A | 11/1994 | Watanabe |
| 5,381,036 A | 1/1995 | Bigler et al. |
| 5,403,784 A | 4/1995 | Hashemi et al. |
| 5,444,600 A | 8/1995 | Dobkin et al. |
| 5,508,565 A | 4/1996 | Hatakeyama et al. |
| 5,521,426 A | 5/1996 | Russell |
| 5,523,617 A | 6/1996 | Asanasavest |
| 5,530,292 A | 6/1996 | Waki et al. |
| 5,563,443 A | 10/1996 | Beng et al. |
| 5,585,668 A | 12/1996 | Burns |
| 5,789,808 A | 8/1998 | Yamasaki et al. |
| 5,843,809 A | 12/1998 | Rostoker |
| 6,114,756 A | 9/2000 | Kinsman |
| 6,259,153 B1 * | 7/2001 | Corisis |
| 6,297,544 B1 * | 10/2001 | Nakamura et al. |

* cited by examiner

INTERDIGITATED CAPACITOR DESIGN FOR INTEGRATED CIRCUIT LEAD FRAMES

BACKGROUND OF THE INVENTION

CROSS REFERENCE TO RELATED APPLICATIONS

This application is a continuation of application Ser. No. 09/543,032, filed Apr. 5, 2000, now U.S. Pat. No. 6,265,764, issued Jul. 24, 2001, which is a continuation of application Ser. No. 09/053,182, filed Apr. 1, 1998, now U.S. Pat. No. 6,114,756, issued Sept. 5, 2000.

FIELD OF THE INVENTION

This invention relates generally to semiconductor devices. More particularly, the invention pertains to apparatus for suppressing undesirable high frequency induction noise in high speed integrated circuits (ICs).

STATE OF THE ART

Modem semiconductor devices including integrated circuit (IC) devices, such as DRAM and SRAM devices have electrically conductive internal leads and output drivers which are switched ON and OFF. The switching operations between no current and peak current is very rapid and may cause rapid changes in the power supply voltage and spikes within the lead circuits and the die circuits. Such induced voltage and current variations cause malfunctions of the integrated circuit and may severely limit the clock speed at which the device may be satisfactorily operated. The problem is particularly relevant in devices having a large number of leads, where many leads may be simultaneously switched ON to cause a large, sudden current drain.

The goal of decoupling capacitors is to provide a system whereby the actual ranges of voltage and current in each part of the circuit during the ON and OFF stages are relatively narrow, i.e. positive and negative spikes are avoided, even at high frequency operation.

A typical semiconductor device comprises a semiconductor die, leads for connecting the die circuit to a host apparatus, and packaging for enclosing and sealing the device. The leads are generally formed as part of a lead frame constructed from a metal foil or as a metal film on a polymeric base such as in tape automated bonding (TAB).

In a typical conventional device configuration, a conductive lead frame includes a "paddle", "island", or "die mounting pad" upon which the die is mounted. In addition, inner leads are configured to approach the die edges having electrically conductive connection (bond) pads. The bond pads are input/output (I/O) electrodes of the die circuitry which enable connection through inner and outer leads to electronic apparatus. The inner leads and bond pads are normally connected by fine gold wires to provide power supply, ground and various signal connections. The die, connecting wires, and inner leads are then encapsulated to form a package which has outer leads which can be connected to an electrical apparatus such as a circuit board.

In a typical leads-over-chip (LOC) configuration, the die is mounted to the lead frame leads. Some or all of the lead frame leads overlie portions of the die and are connected to bond pads which may be centrally located or positioned near the periphery of the active die surface. A layer of insulative material such as adhesive tape is typically used to electrically insulate the overlying leads from the active die surface. Alternately, a multi-layer lead frame or a lead frame plus an additional mounting substrate may be used to provide the die support, as well as the inner leads to be mounted atop the die.

Regardless of the particular configuration of the wire-bonded device, the length-to-width ratio of the fine wires and inner leads is relatively high, and the wires and leads function as inductors to cause interference and cross-talk. Other factors which increase inductive interference include denser packing of leads and operation at higher clock speeds.

Various solutions for overcoming this deficiency in semiconductor construction have been proffered and typically include the addition of decoupling capacitors.

One approach has been to install separate decoupling capacitors on a circuit board and wire them across the power supply and return connections to the semiconductor device. In such designs, the relatively long distance between capacitors and the semiconductor die reduces the effectiveness of the capacitors, and may even increase the deleterious inductance. Exemplary decoupling capacitors for external connection to a packaged device are shown in U.S. Pat. No. 5,155,656 to Narashimhan et al., for example.

Various attempts have been made to more effectively decouple inductance by positioning the capacitor(s) more closely to the die. For example, an early method is shown in U.S. Pat. No. 3,460,010 to Domenico et al., in which the inactive side of the chip is subjected to multiple diffusion steps, and a capacitative layer is formed on and in the die. Other patents showing a capacitor within a die structure include U.S. Pat. Nos. 3,538,397 and 3,772,097 to Davis, U.S. Pat. No. 3,769,105 to Chen et al., U.S. Pat. No. 4,737,830 to Patel et al., U.S. Pat. No. 4,777,518 to Mihara et al. and Japanese Patent Application No. Sho 61[1986]-73367. The manufacturing processes shown in these references are expensive and complex, requiring a significant number of extra production steps. In addition, their effectiveness in actual use is somewhat less than desired.

Other methods for locating a capacitor close to the semiconductor die have been tried. For example, a separate capacitance structure has been attached to either of the "active" die surface, the mounting surface of the die, a substrate, or to the lead frame. Exemplary of such designs are U.S. Pat. No. 4,410,905 to Grabbe, U.S. Pat. No. 5,281,556 to Shimizu et al., U.S. Pat. No. 4,656,605 to Clayton, U.S. Pat. No. 5,212,402 to Higgins III, U.S. Pat. No. 5,266,821 to Chern et al., U.S. Pat. No. 5,103,283 to Hite, and U.S. Pat. No. 4,994,936 to Hernandez.

In Japanese Patent Disclosure No. 4-188759 of Tachibana, a separate conductive member is interleaved with the lead frame paddle to form a capacitor. The separate member and paddle are respectively connected to the ground and Vcc bond pads of the overlying die. Somewhat similar structures using multi-layered capacitor construction are shown in German Patent DE 3626151 A 1 to Goetz, Japanese Patent Publication JP3165549A of Sato, Japanese Patent Publication No. JP4188759 of Masanori, Japanese Patent Publication No. JP4162657 of Hiroyuki, Japanese Publication No. JP3276747 of Natsuko, U.S. Pat. No. 5,140, 496 of Heinks et al., U.S. Pat. No. 4,891,687 of Mallik et al., U.S. Pat. No. 4,965,654 of Karner et al., U.S. Pat. No. 4,680,613 of Daniels et al., and Shinko catalogue, Hyperquad Series Types, Three Metal Layer QFP (1994).

In U.S. Pat. No. 5,444,600 to Dobkin et al. is shown a capacitor formed by interdigitated portions of a lead frame. Multiple semiconductor dies are mounted on separate paddles such that a ground connection to a first capacitor section and a power supply connection to a second capacitor section of the same capacitor couple are made from different semiconductor dies.

U.S. Pat. No. 5,105,257 of Michii describes a lead frame construction including a planar ground lead, a portion of which is attached to a die, and two power supply leads, one on each side of the semiconductor die.

SUMMARY OF THE INVENTION

The invention comprises an interdigitated lead frame paddle or bus configuration for integrated circuit (IC) devices such as dynamic random access memory (DRAM) chips, static random access memory (SRAM) chips, read only memory (ROM) chips, microprocessors and the like. The two separated portions of the conductive lead frame paddle are respectively connected to the power supply (Vss) and ground (Vcc) buses or bond pads to provide capacitative protection from inductive spikes in the ground and power supply circuits.

In a conventional semiconductor device assembly, the two-part lead frame paddle provides support for the die mounted thereon and acts as a source of decoupling capacitance for the power supply and ground circuits.

In a LOC-type configuration assembly, the separated lead frame portions comprise an interdigitated power supply bus and a ground bus which overlie the die and provide decoupling capacitance in the power supply and ground circuits.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

The invention provides a lead frame construction which includes a decoupling capacitor for the power supply and ground circuits of a semiconductor device without requiring any additional parts. The portion of a lead frame otherwise used as a die attach paddle or as a pattern of inner lead-over-chip (LOC) leads is bifurcated and interdigitated to become an effective decoupling capacitor pair. Thus, the capacitor is totally within the device package without enlarging the dimensions of the package. In addition, the number of steps to produce the device is not increased, or only minimally increased over producing a semiconductor device having no decoupling capacitor. The additional complex manufacturing steps found in prior art methods for adding decoupling capacitance are avoided.

In this description, the term "active surface" refers to the entire planar surface of a die, where a plurality of conductive bond pads is formed on the surface.

The term "corresponding" refers to any two conductive terminals which are intended to be conductively joined by a bond wire or other conductor toward achieving the desired device.

Figure 1:
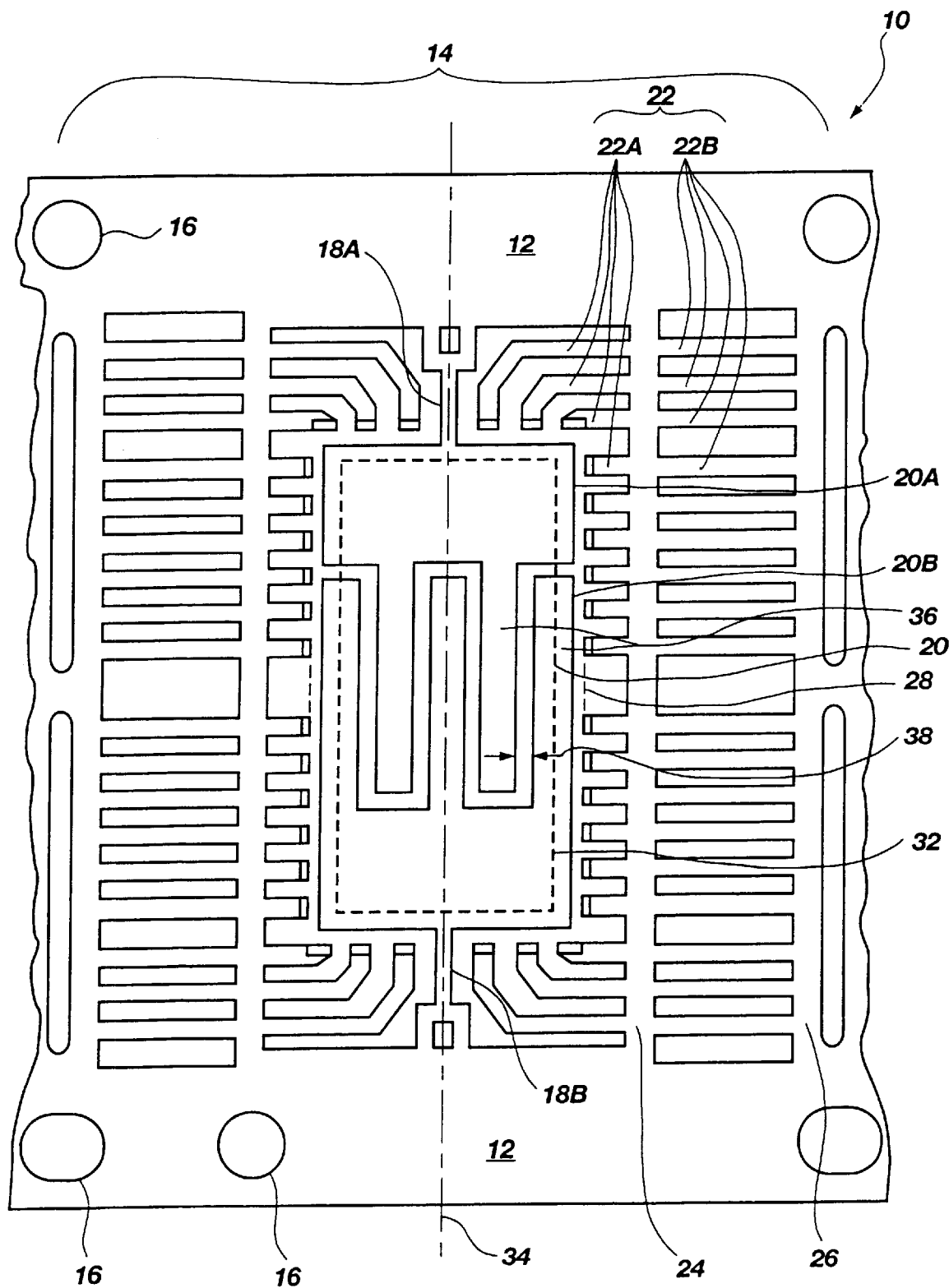
FIG. 1 is a plan view of a portion of a lead frame of the invention for a semiconductor die having bond pads along multiple edges.

As shown in drawing FIG. 1, a portion of an electrically conductive lead frame strip 10 is shown generally with lateral rails 12. The lead frame strip 10 may be formed from thin stamped metal or as a metallized polymeric film, e.g. as in tape automated bonding (TAB). The single lead frame 14 shown is but one of a plurality of lead frames which normally is part of the lead frame strip 10. Registration holes 16 in the lateral rails 12 are useful for accurate movement and alignment of the lead frame strip 10 during lead frame manufacture, die attach, wire bonding, encapsulation, and lead singulation. The single lead frame 14 includes a plurality of leads 22 comprising inner lead portions 22A and outer lead portions 22B. The leads 22 are supported by dam bars 24 and cross bars 26 which extend to the lateral rails 12, as known in the art. The inner lead portions 22A terminate at a space 28 which will surround a semiconductor die 30, not shown, for attachment of the inner lead portions to the semiconductor die by short wire conductors. In the example shown, the inner lead portions 22A are configured to be wirebonded to bond pads along four edges of a die surface. Within the space 28 is a paddle 20 for supporting such a die.

In conformance with the invention, the single lead frame 14 is manufactured with a two part die-attach member, i.e. "paddle" 20. The paddle 20 is bifurcated into a first capacitor sector or portion 20A and a second capacitor sector or portion 20B. Each capacitor portion 20A, 20B is supported by, i.e. connected to, one of the lateral rails 12 by at least one paddle bar 18A, 18B. First capacitor portion 20A is shown with first paddle bar 18A, and second capacitor portion 20B is shown with second paddle bar 18B. Shown on the capacitor portions 20A, 20B is a die mount outline 32 upon which a semiconductor die 30 is mounted (see drawing FIG. 2). A trans-strip centerline is generally shown at 34 and bisects the capacitor portions 20A, 20B and semiconductor die 30.

The two-part capacitor may be supported during construction by joining the two capacitor portions 20A, 20B with an insulative adhesive sheet or tape on either of the upper surface or lower surface of the capacitor portions.

As shown in drawing FIG. 1, the capacitor portions 20A, 20B have legs 36 which are elongated in the direction of centerline 34. The legs 36 are interdigitated and separated by narrow space 38 to enhance capacitance. The capacitor portions 20A, 20B generally lie in the same plane and each has a single conductive layer.

The lead frame strip 10 of the invention may be formed without any additional steps over a conventional lead frame strip having a one-piece die support paddle.

Figure 2:
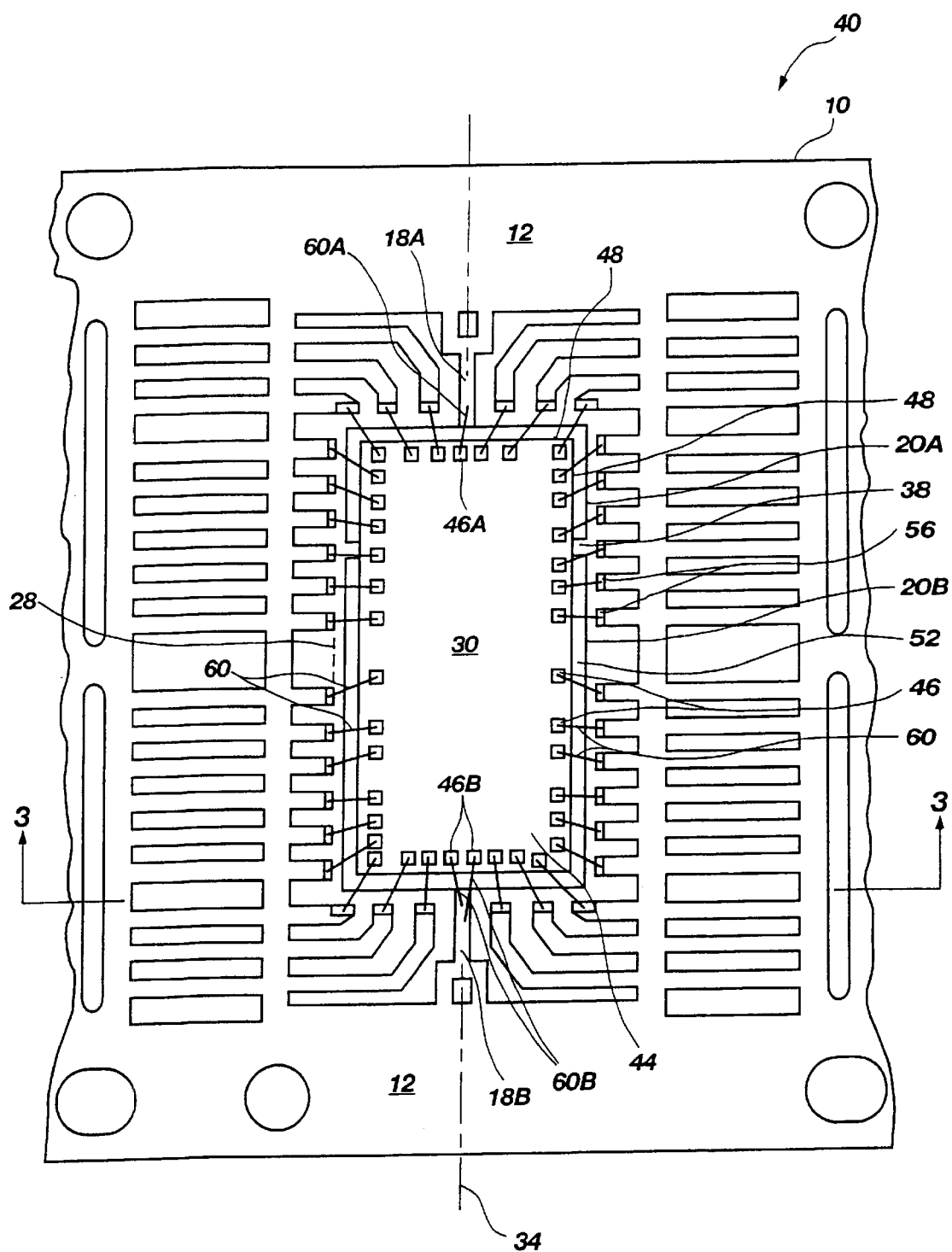
FIG. 2 is a plan view of a die-bonded and wire-bonded semiconductor device incorporating a lead frame of the invention.
Figure 3:
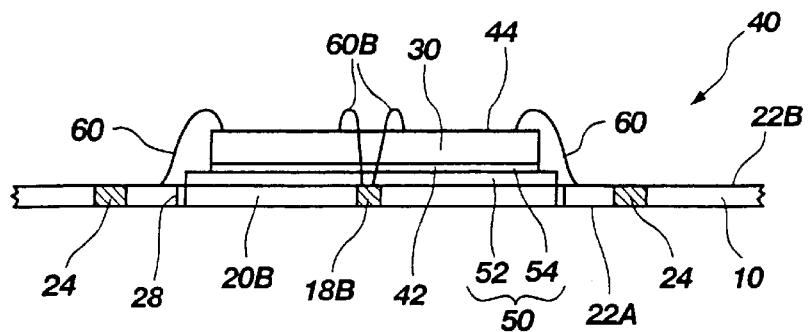
FIG. 3 is a sectional view of a die-bonded and wire-bonded semiconductor device incorporating a lead frame of the invention, as taken along line 3—3 of FIG. 2.

Drawing FIGS. 2 and 3 illustrate a semiconductor device 40 having the single lead frame 14 of drawing FIG. 1. An exemplary semiconductor die 30 has its back side 42 mounted on capacitor portions 20A and 20B, i.e. the two-piece paddle 20, by a bonding medium 50 which includes an electrically insulative material. Such materials are well known in the art and include adhesives and tapes formed of e.g. polyimide. As shown in drawing FIG. 3, the bonding medium 50 comprises an insulative layer 52, such as polyimide tape, to which the semiconductor die 30 is bonded with an adhesive 54. In this case, adhesive 54 may be either electrically conductive or non-conductive.

The semiconductor die 30 has an active surface 44 opposite the back side 42 and conductive bond pads 46 are shown arrayed along the four edges 48 of the active surface. Other configurations of the lead frame strip 10 may be used for semiconductor dice 30 having bond pads 46 along fewer than four edges 48.

The bond pads 46 on the active surface 44 of the semiconductor die 30 are electrically connected to bond surfaces 56 of the inner leads 22A by bond wires 60, such as by the use of techniques well known in the art, e.g. thermocompression, thermosonic, and ultrasonic wire bonding methods. The bond wires 60 are typically formed of gold, although other metals have been used. For the sake of clarity, many of the bond wires 60 are not shown in drawing FIG. 3.

For purposes of illustration, capacitor portion 20A (see drawing FIG. 1) is designated as a power supply capacitor and its paddle bar 18A is connected by bond wire(s) 60A to bond pad(s) 46A which are power supply terminals, e.g. Vss bond pads. Likewise, capacitor portion 20B is designated as a ground capacitor and its paddle bar 18B is connected by bond wires 60B to bond pads 46B which are ground terminals, e.g. Vcc bond pads. Thus, the capacitor portions 20A, 20B are directly connected to the appropriate bond pads 46 of the semiconductor die 30 by bond wires 60 to provide capacitance in the power supply circuits and ground circuits very close to the die.

Figure 4:
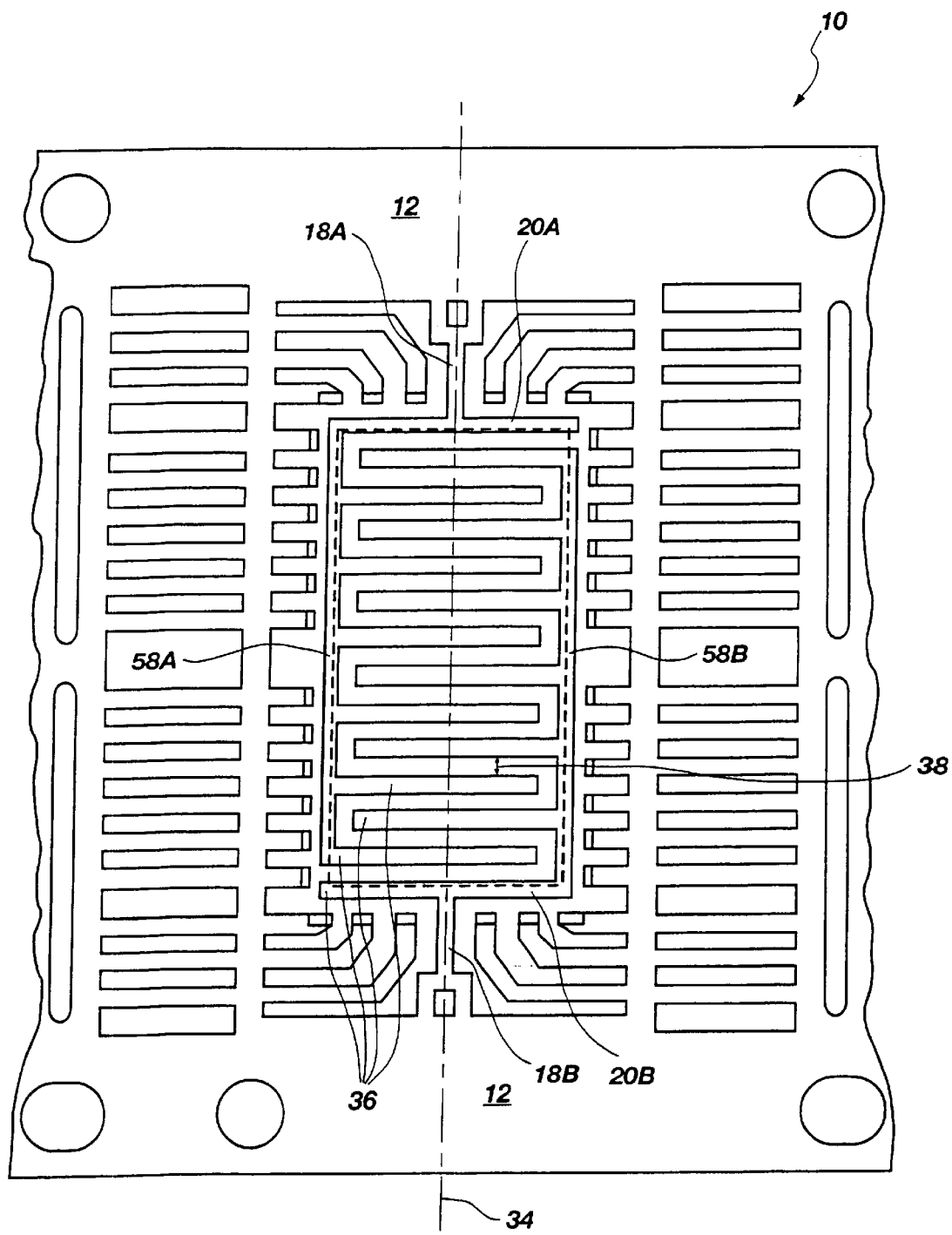
FIG. 4 is a plan view of a portion of another embodiment of a lead frame of the invention for a semiconductor die having bond pads along multiple edges.
Figure 5:
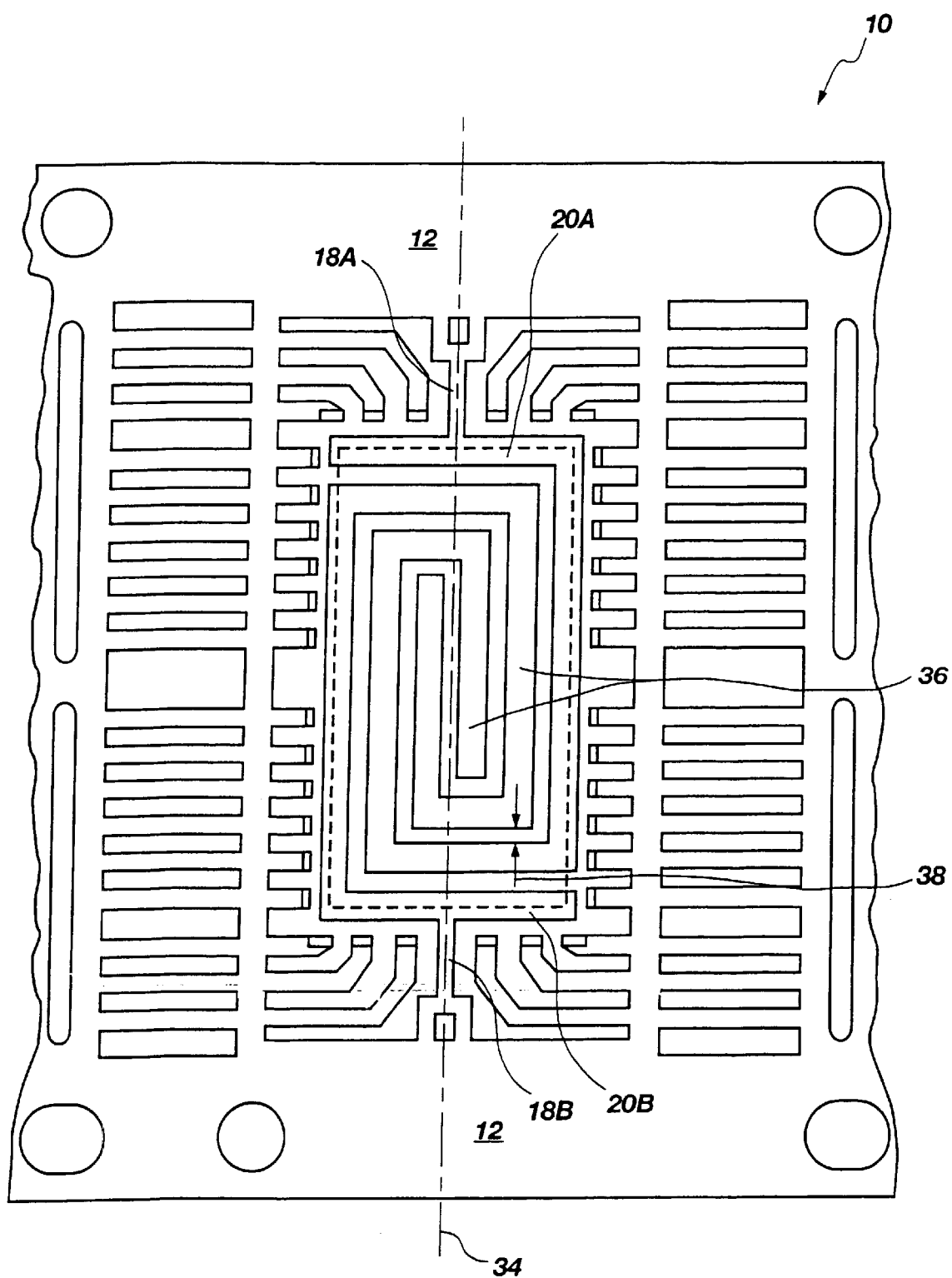
FIG. 5 is a plan view of a portion of a further embodiment of a lead frame of the invention for a semiconductor die having bond pads along multiple edges.

Drawing FIGS. 4 and 5 illustrate the variety of interdigitation patterns which may be used to make the two-piece paddle 20. As illustrated in drawing FIG. 4, each capacitor portion 20A, 20B includes a plurality of alternating interdigitated legs 36 extending from bus portions 58A, 58B and having long dimensions in a direction perpendicular to the trans-strip centerline 34.

In drawing FIG. 5, each of the capacitor portions 20A, 20B has a leg 36 which is formed as a cornered "coil" separated by narrow space 38 from the "coil" of the other capacitor portion.

The configurations of capacitor portions 20A, 20B of paddle 20 which are depicted in drawing FIGS. 1, 4 and 5 are not exhaustive. Other interdigitated patterns may be used, and their usability is subject to (a) matching of the electrical capacitance characteristics to the particular semiconductor die 30 to achieve the desired decoupling, and (b) ease of manufacture and cost.

Figure 6:
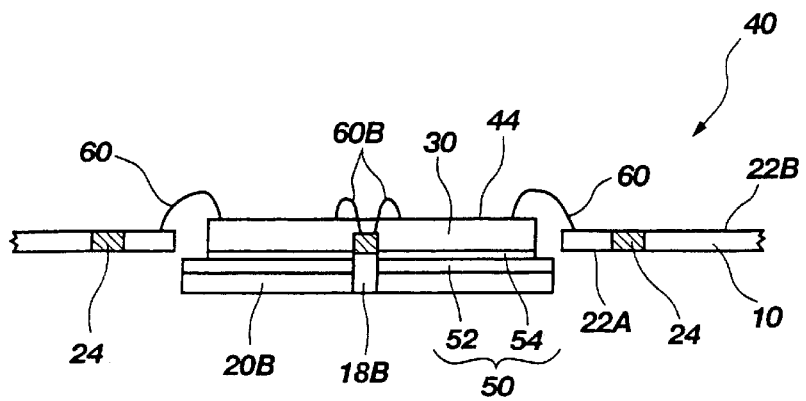
FIG. 6 is a sectional view of a die-bonded and wire-bonded semiconductor device incorporating another embodiment of the lead frame of the invention, as taken along line 3—3 of FIG. 2.

The paddle 20 of the lead frame strip 10 may be depressed so that the active surface 44 of the semiconductor die 30 is more closely aligned with the bond surfaces 56 of the inner lead portions 22A. As shown in drawing FIG. 6, capacitor portion 20B is shown as being supported at a lower level than the inner leads 22A, and paddle bars 18B (and 18A, not visible) extend from one level to the other. In contrast to the embodiment of drawing FIG. 3, the bond wires 60 of drawing FIG. 6 may be shorter, and thus less susceptible to producing electronic interference.

Figure 7:
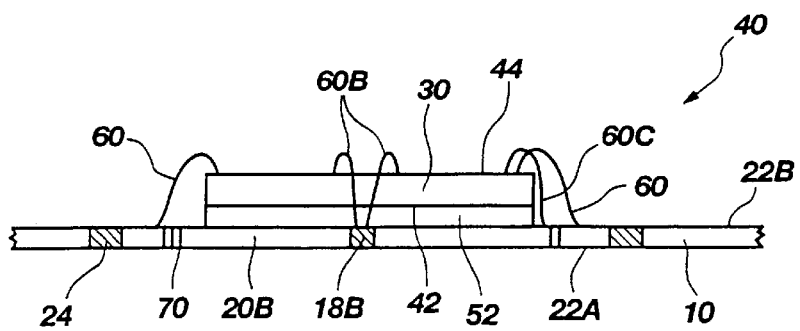
FIG. 7 is a sectional edge view of a portion of a semiconductor device incorporating a lead frame of the invention.

Down-bonding of the semiconductor die 30 to the two-part paddle 20 may take a variety of forms in addition to that illustrated in drawing FIG. 3. In drawing FIG. 7, for example, insulative layer 52 may be a layer of non-conducting adhesive such as epoxy or an adhesive coated tape formed of a polymer such as polyimide. While layer 52 may entirely cover the die attach paddle 20, bond pads 46 may be connected by bond wires 60C to the capacitor portions 20A and/or 20B by deleting the insulative layer 52 where a bond wire connection is to be made. The insulative layer 52 may be made to provide an exposed outer portion 70 of the capacitor portion 20A and/or 20B. Thus, short connections may be made from anywhere on the periphery of the semiconductor die 30.

Figure 9:
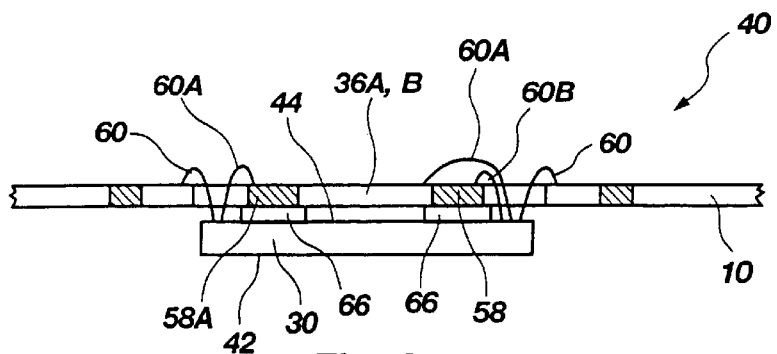
FIG. 9 is a sectional edge view of a die-bonded and wire-bonded semiconductor device of the invention, as taken along line 9—9 of FIG. 8.
Figure 8:
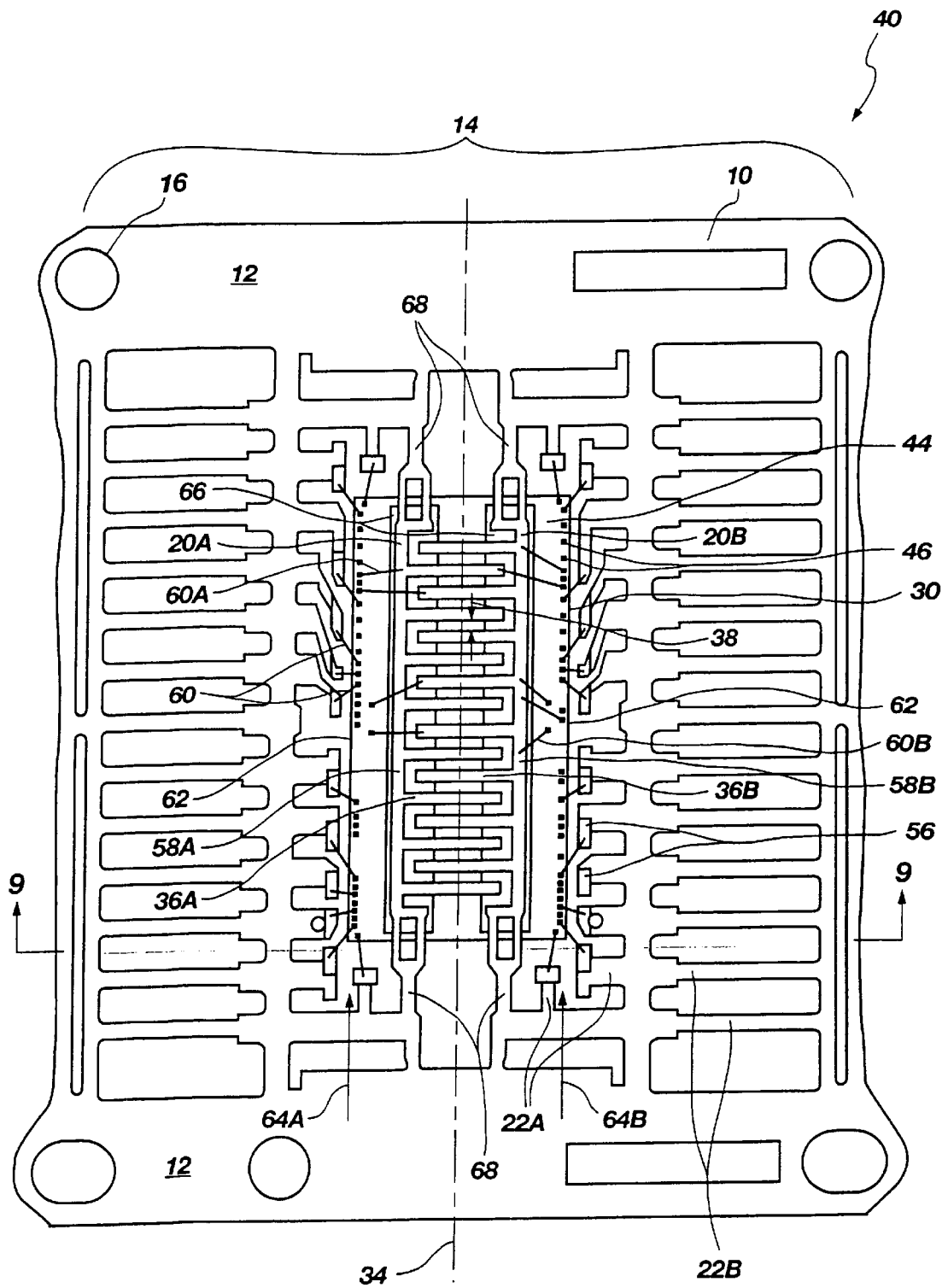
FIG. 8 is a plan view of a die-bonded and wire-bonded semiconductor device of the invention including a lead frame of the invention and a die configured for central LOC bonding.

In another embodiment of the invention shown particularly in drawing FIGS. 8 and 9, an electrically conductive lead frame strip 10 has lateral rails 12 with registration holes 16, and a plurality of lead frames 14. Each lead frame 14 includes integral interdigitated capacitor portions 20A, 20B which are attached in a lead-over-chip (LOC) fashion to the active die surface 44, i.e. to a portion thereof which does not contain bond pads 46. Thus, the capacitor portions 20A, 20B are attached to the active surface 44 instead of the back side 42 of the semiconductor die 30. The capacitor portions 20A, 20B together comprise an interdigitated capacitative power bus and ground bus combination for the semiconductor device 40.

The configuration of inner leads 22A (with bonding surfaces 56) and outer leads 22B is designed to accommodate the particular input/output bond pads 46 of a semiconductor die 30 and the requirements of the host electronic apparatus to which the semiconductor device 40 is to be conductively joined. In the example of drawing FIGS. 8 and 9, the semiconductor die 30 is shown with arrays 64A and 64B of conductive bond pads 46 along opposing long edges 62 of the semiconductor die 30. Bond pads 46 are connected to corresponding bonding surfaces 56 of the inner leads 22A by conductive bond wires 60 as previously described. The part of the lead frame strip 10 which comprises the capacitor portions 20A, 20B is positioned between the two opposing arrays 64A, 64B and bonded to the active surface 44 of the semiconductor die 30, with intervening electrically insulative members 66. Separation of the capacitor portions 20A, 20B from the semiconductor die 30 prevents shorting therebetween. Insulative members 66 may be, for example, strips of polymer such as adhesive coated polyimide tape.

In the embodiment of drawing FIG. 8, each capacitor portion 20A, 20B includes a main bus 58A, 58B respectively, parallel to centerline 34 and joined to the lateral rails 12 by support bars 68. From each bus 58A, 58B extends inwardly a plurality of perpendicular legs 36A, 36B, respectively, which are sequentially alternated. Legs 36A and 36B are physically separated by a narrow space 38 to provide the desired capacitative characteristics and to prevent shorting. A typical range of narrow space 38 is from about 75 microns to about 200 microns.

This construction of the capacitor portions 20A, 20B permits short wire bonding to either capacitor portion 20A or 20B from either bond pad array 64A or 64B.

As shown in FIG. 2, bond pads 46A (such as Vss) configured for attachment to a power supply capacitor portion 20A are bonded thereto by a bond wire 60A. Bond pads 46B (such as Vcc) which are configured for attachment to a ground capacitor portion 20B are bonded thereto by bond wire 60B.

Following attachment of the semiconductor die 30 to the lead frame 14, completion of the wire bonding process, and any post-wire bond testing steps, the semiconductor die 30 and inner lead portions 22A are typically encapsulated with polymer such as epoxy to form the packaged device. The outer lead portions 22B are then singulated by cutting them free of the dam bars 24 and cross bars 26. Although the paddle bars 18A, 18B or support bars 68 may be formed with conductive "outer lead" portions, in most cases, the paddle bars or support bars are cut free of the lateral rails, with only a small portion of the paddle bars remaining for the desired wire bonding to bond pads 46A, 46B of the semiconductor die 30.

The outer leads 22B may be configured into any usable form, including conventional lead designs well known in the art.

Thus, the lead frame strip 10 may be formed in general accordance with known processes and without changing the strip dimensions, number of levels, or materials.

It is evident that the broad production processes in producing the above described semiconductor devices are no different from that of the prior art. However, the unique lead frame configuration and electrical connections made thereto provide a device with an effective integral decoupling capacitor construction without increasing or complicating the production steps, without requiring additional parts, without any increase in package size, and with a cost savings over other decoupling methods.

The heat transfer characteristics of the semiconductor device 40 are not substantially changed by modifying the lead frame paddle 20.

The devices formed by the foregoing methods also avoid the problems of package delamination which often occur when large planar plates are incorporated into a device, either above the die or below the lead frame.

The illustrated embodiments of the invention are by way of example only and are not intended to limit the scope thereof. The invention may be applied to other types of semiconductor devices, and the invention encompasses variations in capacitor shape, materials of construction, bonding methods, etc. The long dimension of the semiconductor die 30 relative to the lead frame strip 10 may be rotated from the direction shown in the figures without changing the essence of the invention.

It is apparent to those skilled in the art that such changes and modifications may be made to the capacitance enhanced semiconductor of the invention and its manufacturing method as disclosed herein without departing from the spirit and scope of the invention as defined in the following claims.

What is claimed is:

1. A semiconductor device assembly, comprising:
   a semiconductor die having a plurality of circuits formed thereon, having an active surface, having a plurality of bond pads on said active surface, and having an opposing back side;
   a lead frame including a plurality of inner leads extending over a first plane, at least one lead of the plurality of inner leads corresponding to a bond pad of said plurality of bond pads of said semiconductor die, a plurality of outer leads, at least one outer lead of said plurality of outer leads connected to at least one inner lead of said plurality of inner leads, and a bifurcated die mounting member including a pair of generally coplanar interdigitated sectors extending over a second plane different from said first plane; and
   at least one conductive wire connecting at least one bond pad of said plurality of bond pads of said semiconductor die to at least one corresponding inner lead of said plurality of inner leads of said lead frame.

2. The semiconductor device assembly of claim 1, wherein said semiconductor die is adhesively connected to said bifurcated die mounting member.

3. The semiconductor device assembly of claim 2, wherein said semiconductor die and said bifurcated die mounting member are adhesively connected to an insulative member located therebetween.

4. The semiconductor device assembly of claim 1, further comprising:
   a first electrical connection from one of said pair of generally coplanar interdigitated sectors to a power supply Vss bond pad of said plurality of bond pads of said semiconductor die.

5. The semiconductor device assembly of claim 4, further comprising:
   a second electrical connection from the other of said pair of generally coplanar interdigitated sectors to a ground Vcc bond pad of said plurality of bond pads of said semiconductor die.

6. The semiconductor device assembly of claim 1, further comprising
   conductive wires connecting said plurality of bond pads and said at least one corresponding inner lead of said plurality of inner leads.

7. The semiconductor device assembly of claim 1, wherein said lead frame comprises a single conductive layer.

8. The semiconductor device assembly of claim 1, wherein said lead frame comprises a single layer of metal stamped to form said plurality of inner leads, said plurality of outer leads, and said bifurcated die mounting member.

9. The semiconductor device assembly of claim 1, wherein said lead frame comprises a single conductive layer fixed to an insulative base layer.

10. The semiconductor device assembly of claim 1, wherein said bifurcated die mounting member comprises a two-part paddle for attachment to the back side of said semiconductor die.

11. The semiconductor device assembly of claim 10, wherein said bifurcated die mounting member is adhesively attached to said semiconductor die.

12. The semiconductor device assembly of claim 1, wherein said bifurcated die mounting member comprises a lead-on-chip (LOC) member for attachment to the active surface of said semiconductor die.

13. The semiconductor device assembly of claim 12, wherein said bifurcated die mounting member is adhesively attached to the active surface of said semiconductor die having an intervening insulative layer therebetween.

14. A semiconductor device assembly, comprising:
   a semiconductor die having a plurality of circuits formed thereon, having an active surface, having a plurality of bond pads on said active surface, and having an opposing back side;
   a lead frame including a plurality of inner leads extending over a first plane, at least one lead of the plurality of inner leads corresponding to at least one bond pad of said plurality of bond pads of said semiconductor die, a plurality of outer leads, at least one outer lead of said plurality of outer leads connected to at least one inner lead of said plurality of inner leads, and a bifurcated die mounting member including a pair of generally coplanar interdigitated sectors extending over a second plane different from said first plane;
   an insulative member adhesively connected to said semiconductor die and said bifurcated die mounting member;

a first electrical connection from one of said pair of generally coplanar interdigitated sectors to a power supply Vss bond pad;

a second electrical connection from the other of said pair of generally coplanar interdigitated sectors to a ground Vcc bond pad; and at least one conductive wire connecting said at least one bond pad of said plurality of bond pads to said at least one inner lead of said plurality of inner leads; and a plurality of conductive wires connecting said plurality of bond pads and said at least one inner lead of said plurality of inner leads.

15. The semiconductor device assembly of claim 14, wherein said lead frame comprises a single conductive layer.

16. The semiconductor device assembly of claim 14, wherein said lead frame comprises a single layer of metal stamped to form said plurality of inner leads, said plurality of outer leads, and said bifurcated die mounting member.

17. The semiconductor device assembly of claim 14, wherein said lead frame comprises a single conductive layer fixed to said insulative member wherein said insulative member includes a base layer.

18. The semiconductor device assembly of claim 14, wherein said bifurcated die mounting member comprises a two-part paddle for attachment to the back side of said semiconductor die.

19. The semiconductor device assembly of claim 14, wherein said bifurcated die mounting member comprises a lead-on-chip (LOC) member for attachment to the active surface of said semiconductor die.

20. The semiconductor device assembly of claim 19, wherein said bifurcated die mounting member is attached to said insulative member that is attached to the active surface of said semiconductor die.

21. A conductive lead frame strip for a semiconductor device, comprising a strip of polymeric film having a conductive layer, lateral rails, and a plurality of spaced lead frames wherein each lead frame of said plurality of spaced lead frames includes a pattern of a plurality of conductive inner leads and a plurality of conductive outer leads and a die support member bifurcated into two interdigitated capacitor portions, said portions comprising a decoupling capacitor, said two interdigitated capacitor portions are generally coplanar, configured for bonding to a semiconductor die, and configured for wire bond connections to Vss and Vcc bond pads of a semiconductor die, respectively.

22. The conductive lead frame strip of claim 21, wherein said bifurcated die support member is generally centrally positioned in said each lead frame of the plurality of lead frames.

23. A method for producing a lead frame including an inductance decoupling capacitor for a semiconductor device using a strip of metallized polymeric film, said method comprising:

removing portions of said metallized polymeric film to form a plurality of patterns in said strip including a pair of opposed side rails, each pattern of said plurality of patterns including a plurality of inner and outer leads supportively connected to said pair of opposed side rails and two separated, interdigitated die attach members, said two separated interdigitated die attach members configured to be a decoupling capacitor couple, said removing portions of said metallized polymeric film to form said plurality of patterns in said strip including said pair of opposed side rails, said each pattern of said plurality of patterns including said plurality of inner and outer leads supportively connected to said pair of opposed side rails and said two separated interdigitated die attach members comprises forming a pattern including two coplanar, separated, and interdigitated die attach members.

24. A method for producing a semiconductor device assembly having an inductance decoupling capacitor formed from a strip of metallized polymeric film, comprising:

removing portions of said metallized polymeric film to form a plurality of patterns in said strip including a pair of opposed side rails, each pattern of said plurality of patterns including a plurality of inner leads and a plurality of outer leads supportively connected by bars to said pair of opposed side rails and at least two separated interdigitated die attach members supportively connected to said pair of opposed side rails by paddle bars, said at least two separated interdigitated die attach members configured to be a decoupling capacitor couple;

providing a semiconductor die having an active surface and a back side, and a plurality of bond pads on said active surface, a first portion of said plurality of bond pads configured to be conductively connected to a power supply, a second portion of said plurality of bond pads configured to be conductively connected to ground, and a third portion of said plurality of bond pads configured to be connected to said plurality of inner leads;

securing said semiconductor die to said at least two separated interdigitated die attach members;

connecting one of said at least two separated interdigitated die attach members to said first portion of said plurality of bond pads; and connecting the other of said at least two separated interdigitated die attach members to said second portion of said plurality of bond pads; and attaching said at least two separated interdigitated die attach members to said first and second portions, respectively, of said plurality of bond pads by conductive wires.

25. The method of claim 24, wherein said attaching said at least two separated interdigitated die attach members to said first and second portions, respectively, of said plurality of bond pads by said conductive wires comprises bonding said conductive wires by one of thermocompression, thermosonic bonding and ultrasonic bonding.

26. The method of claim 24, further comprising:

attaching said third portion of said plurality of bond pads to at least one of said plurality of inner leads.

27. The method of claim 24, further comprising:

singulating said plurality of inner leads and said plurality of outer leads from said pair of opposed side rails.

28. The method of claim 27, wherein said singulating includes cutting said paddle bars.

29. The method of claim 28, further comprising:

singulating said at least two separated interdigitated die attach members from said pair of opposed side rails by said cutting said paddle bars.

30. The method of claim 24, wherein said securing said semiconductor die to said at least two separated interdigitated die attach members comprises attaching the back side of said semiconductor die to said at least two separated interdigitated die attach members using an adhesive.

31. The method of claim 30, wherein said attaching the back side of said semiconductor die to said at least two separated interdigitated die attach members comprises attaching said back side of said semiconductor die to said at least two separated interdigitated die attach members using polymeric tape and adhesive.

32. The method of claim 30, wherein said attaching the back side of said semiconductor die to said at least two separated interdigitated die attach members comprises attaching said back side of said semiconductor die to said at least two separated interdigitated die attach members using insulative polymeric adhesive.

33. The method of claim 32, further comprising attaching a portion of said active surface of said semiconductor die to said at least one inner lead of said plurality of inner leads using an insulative layer.

34. The method of claim 32, wherein said attaching the back side of said semiconductor die to said at least two separated interdigitated die attach members comprises attaching said back side of said semiconductor die to said at least two separated interdigitated die attach members using said polymeric tape and adhesive.

* * * * *

UNITED STATES PATENT AND TRADEMARK OFFICE
CERTIFICATE OF CORRECTION

PATENT NO. : 6,396,134 B2
DATED : May 28, 2002
INVENTOR(S) : Larry D. Kinsman

It is certified that error appears in the above-identified patent and that said Letters Patent is hereby corrected as shown below:

Column 1,
Line 24, change "Modem" to -- Modern --

Signed and Sealed this

Twenty-first Day of October, 2003

JAMES E. ROGAN
*Director of the United States Patent and Trademark Office*